(12) United States Patent
Halahmi

(10) Patent No.: US 7,402,341 B2
(45) Date of Patent: Jul. 22, 2008

(54) METHODS AND COMPOSITIONS FOR PRINTABLE SURFACE PRE-TREATMENT

(75) Inventor: Izhar Halahmi, Hod Hasharon (IL)

(73) Assignee: Printar Ltd., Rehovot (IL)

( * ) Notice: Subject to any disclaimer, the term of this patent is extended or adjusted under 35 U.S.C. 154(b) by 0 days.

(21) Appl. No.: 11/805,351

(22) Filed: May 23, 2007

(65) Prior Publication Data

US 2007/0275191 A1  Nov. 29, 2007

Related U.S. Application Data

(60) Provisional application No. 60/802,521, filed on May 23, 2006.

(51) Int. Cl.
- B32B 27/18 (2006.01)
- B32B 27/36 (2006.01)
- B32B 27/30 (2006.01)
- B32B 27/34 (2006.01)
- B32B 27/40 (2006.01)

(52) U.S. Cl. ............... 428/423.1; 428/474.4; 428/480; 428/522; 428/523; 428/532; 427/407.1; 427/414; 427/415; 427/417; 427/384; 427/385.5

(58) Field of Classification Search ............ None
See application file for complete search history.

(56) References Cited

U.S. PATENT DOCUMENTS

| | | | |
|---|---|---|---|
| 6,171,768 B1 * | 1/2001 | Haraga et al. ............... 430/362 |
| 6,447,919 B1 * | 9/2002 | Brown et al. ............... 428/422 |
| 6,465,107 B1 * | 10/2002 | Kelly ............... 428/447 |
| 6,754,551 B1 | 6/2004 | Zohar et al. | |
| 6,855,418 B2 * | 2/2005 | Yamazaki et al. ...... 428/355 EP |
| 7,166,156 B2 | 1/2007 | Parrinello et al. | |
| 7,241,333 B2 * | 7/2007 | Koike et al. ............... 106/31.59 |
| 7,252,923 B2 * | 8/2007 | Kobayashi ............... 430/270.1 |
| 2006/0170836 A1 * | 8/2006 | Kondo et al. ............... 349/43 |

FOREIGN PATENT DOCUMENTS

| | | | |
|---|---|---|---|
| DE | 20201028 | * | 7/2002 |
| SU | 946992 B | * | 7/1982 |
| WO | WO 2004/056562 | * | 7/2004 |
| WO | WO 2006/008518 | * | 1/2006 |

* cited by examiner

*Primary Examiner*—Vivian Chen
(74) *Attorney, Agent, or Firm*—Welsh & Katz, Ltd.

(57) ABSTRACT

Methods and aqueous surface coating compositions are provided for producing a high-resolution ink-jet ink printable coating layer on a surface, the composition comprising at least one polymer selected from a water soluble polymer and a water-emulsifiable polymer, wherein the at least one polymer is present in a concentration of up to 10% by weight and at least one surfactant comprising a long hydrophobic moiety, wherein the at least one surfactant is present in a concentration of up to 10% by weight. The high-resolution ink-jet ink printable coating layer is characterized by its ability to be removed by spraying with water, and yet having excellent resistance to heat and acid, when coated with cured legend ink.

27 Claims, 2 Drawing Sheets

METHODS AND COMPOSITIONS FOR PRINTABLE SURFACE PRE-TREATMENT

This Application claims benefit of Provisional Application No. 60/802,521, filed May 23, 2006.

FIELD OF THE INVENTION

The present invention relates generally to methods and compositions for the pre-treatment of a surface, and more particularly to methods and compositions for pre-treating a surface finish of printed boards which is to withstand harsh processing.

BACKGROUND OF THE INVENTION

In order to meet the growing demands for miniaturized devices and electronic equipment and gadgets containing the devices, the semiconductor industry is moving fast from micro-electronics to nano-electronics. In order to accommodate this trend, process design must follow suite and become yet more sophisticated and cost-effective.

A specialized sector of the semiconductor industry is the printed circuit board (PCB) sector.

Forming a printed circuit board (PCB) involves many process steps. One of the final steps is coating of the PCB with solder mask to protect all features, apart from the conducting elements or pads from environment attack. Solder masks may be glossy, semi mat or mat. The mat effect is provided by incorporation of inorganic particles that cause the surface to be rough.

One essential process step in this industry is printing on the device to label it. This normally involves printing onto a solder mask. The printing may be achieved by indirect methods (through the mediation of a tool or mask or screen) or direct (digital printing—ink jet for example).

In the case of direct printing, ink jet inks are used to print onto the printed circuit board (PCB). An application that has already been commercialized is the digital printing of marking ink of a legend on the solder mask that covers the outer layers of a PCB. The ink is usually white and is cured by UV, by heat or by both.

In the case of printing onto a solder mask, high resolution is obtained only on glossy solder masks. When solder mask is semi mat or mat, the ink resolution is poor, due to propagation of ink before drying and/or curing.

Ideally, print quality should be independent of mask/substrate properties, though, in practice, the art does not teach how to realize this ideal.

Ink from an ink jet is characterized by low viscosity, usually less than 15 cp at the jetting temperature, and low surface tension, usually between 28 to 32 dynes/cm.

Due to these properties, the ink propagates easily on surfaces with a high surface tension, usually above 50 dynes/cm, and/or of a high surface area. Examples of such surfaces are mat and semi-mat solder resists of printed circuit boards, where the surface is characterized by high content of porosity and metal oxides particles.

On glossy surfaces having surface tension in the range of 28-50 dynes/cm, print quality is excellent. In the other hand, on glossy surfaces of a low surface tension, the ink tends to de-wet the surface.

For both too high and too low surface tension solder masks, the jet printed print tends to be of a poor quality.

For high surface tension substrates or masks, thin lines tend to broaden, lines spread into areas or domains, line sharpness is poor, ink thickness is reduced and characters consequentially become illegible.

For low surface energy substrates or masks, lines form droplets, pin-holes and "eyes" on the printed surfaces, and the characters also become illegible.

Some publications in the art include:

U.S. Pat. No. 6,754,551 to Zohar, et al., which describes a jet print apparatus and method for printed circuit board manufacturing. A jet dispensing print system for dispensing a liquid or viscous, jettable substance as a pattern onto the surface of a PCB in an industrial manufacturing PCB production line is described.

The system includes a printing system having a printing bridge system, which includes a static and rigid printing bridge to accommodate in a precise manner several jet print heads, each being fitted with a multitude of jet nozzles.

The jet print heads are utilized to achieve multiple redundancy, whereby part of the total amount of available nozzles are utilized as back-up nozzles. A printing table positioned underneath the static and rigid printing bridge, accommodating a vacuum table with area-addressable suction force, whilst the pattern is dispensed in a jetting manner onto the PCB.

A motorized system, for moving the printing table simultaneously in two perpendicular directions is disclosed, as well as an ink-supply system for supplying the several jet print heads with the liquid or viscous substance.

A control system acts in response to the pattern and PCB dimensional distortions for controlling the system in order to achieve a desired registration precision level for the dispensing of liquid or viscous, jettable substance as the pattern onto the surface of the PCB, and includes an user interface for providing a status report of the printing system.

The jet dispensing PCB print system is utilized for inter alia, legend print, solder mask, etch resist mask, plating resist, temporary (peelable) mask, adhesives, CSP and bare die encapsulation.

U.S. Pat. No. 7,166,156 to Parrinello, et al., discloses an ink recordable substrate coating composition having a pH less than 7. There is described a water resistant coating composition for ink jet recordable substrates having a pH of less than 7, which includes: (a) an aqueous polyurethane dispersion; and (b) an aqueous solution of a nitrogen containing polymeric dye fixative compound. When applied to a suitable substrate, the coating composition allows for the recording of sharp, waterfast images. A coated ink recordable substrate is also disclosed, which includes a substrate having at least one side and at least one side of the substrate has a coating layer derived from the above described coating composition.

There is thus a long felt need to provide a process that enables high digital printing quality on semi mat and mat solder masks.

SUMMARY OF THE INVENTION

The following description is provided, alongside all chapters of the present invention, so as to enable any person skilled in the art to make use of said invention and sets forth the best modes contemplated by the inventor of carrying out this invention. Various modifications, however, will remain apparent to those skilled in the art, since the generic principles of the present invention have been defined specifically to provide means and methods for pre-treatment of solder mask surface for improving the quality of print to be printed thereupon by, for example, an ink jet printer.

Some embodiments of the present invention are directed to processes for modifying a surface, such as the surface of the solder resist and/or of metal conductors on a device or PCB, to allow for high resolution durable printing thereupon.

Some further embodiments of the present invention are directed to compositions and methods for optimizing the surface properties of coating layer on a mask or substrate for improved character legibility, produced by ink jet printing.

Some embodiments of the present invention are directed to a method for forming a solder mask substrate coated with a thin layer that supports high-resolution ink-jet ink legend printing, the method comprising:

i) forming an aqueous solution for surface coating composition for providing a high-resolution ink-jet ink printable coating layer on a surface, the composition comprising:
  a) at least one polymer selected from a water soluble polymer and a water-emulsifiable polymer wherein the at least one polymer is present in a concentration of up to 60% by weight; and
  b) at least one surfactant comprising a relatively hydrophobic moiety, wherein said at least one surfactant is present in a concentration of up to 10% by weight; and ii) applying the solution or dispersion or emulsion onto solder mask surface by means of dipping, immersion, atomizing or spraying so as to form the substrate coated with a film of said polymer having a dry thickness varying from 0.1 to 10 microns and surface tension varying from 24 to 60 dynes/cm.

The dry polymer film is characterized by ability to be washed by spraying with water or by aqueous solutions, and in the other hand, excellent resistance against PCB finishing processes, such as, but not limited to soldering and metal plating, when coated by cured legend ink.

The ratio between fraction of the surfactant comprising the hydrophobic moiety and the fraction of water soluble or emulsifiable polymer is responsible for the surface tension adjustment. The higher the concentration of the hydrophobic agent, the lower the surface tension By that trade-off, one can tune the surface tension of the dry film to the optimal range for printing.

The thickness of the coating film controls the degree of porosity filling of the coated solder mask. Mat solder mask, generally requires higher thickness of coating to seal the porosity, relatively to semi-mat solder mask.

The surface properties of the dry coating layer include, but are not limited to, optimal surface tension, good adhesion to solder mask below and to marking ink above, removability by a standard sprinkler or nozzle based aqueous developer or stripper system typical to PCB shops from all areas that are not covered by legend ink, durability against surface finished and environmental attack in all areas that are covered by legend ink and low surface roughness.

According to some embodiments, the surface tension of the coating layer produced according to the methods of the present invention is in the range of 15-60 dyne/cm.

According to some embodiments, the surface tension is similar or equal to the surface tension of the ink to be printed thereupon. Thus, if the ink has a surface tension of 24-35 dyne/cm, the surface should have a surface tension of up to 40 dyne/cm.

According to some embodiments, the coating layer produced is very smooth, having roughness of less than 0.5 microns.

Additionally, the coating layer produced according to some embodiments of the present invention withstands heat that is usually applied during curing of the legend ink and soldering of the PCB. In typical processes the PCB is heated of up to 250° C., and in some cases, up to 300° C. This includes withstand curing processes, soldering, drying and aging processes of a PCB or device.

The coating layer that is deposited on the surface of the solder mask or metal according to the methods of the present invention has no negative impact on the performance of the device or PCB produced comprising the metal or produced with the solder mask.

Additionally, the coating layer produced does not have a negative impact on the chemical resistance and physical performance of the ink printed thereupon.

According to some embodiments, the coating layer which is not covered by legend ink (i.e not printed) is selectively removable by spraying or immersion the PCB with an aqueous medium. According to some embodiments, the coating layer is formed from an acidic aqueous composition and removal thereof can be attained by a standard alkaline cleaning process using standard dipping or atomizing or sprinklers based systems.

According to some embodiments of the present invention, the compositions of the present invention are environmentally friendly, non-toxic and are economic.

There is thus provided according to some embodiments of the present invention, an aqueous polymer solution, useful as surface coating on mat and semi mat polar surfaces, of an optimized surface tension for high-resolution ink-jet ink, the composition comprising:

at least one polymer selected from a water soluble polymer and a water-emulsifiable polymer, wherein said at least one polymer is present in a concentration of up to 60% by weight; and at least one surfactant, comprising a relatively hydrophobic moiety, wherein said at least one surfactant is present in a concentration of up to 10% by weight, wherein said composition is adapted to provide a removable, high-resolution ink-jet ink printable coating layer of an optimized surface tension of surface tension of 15-70 dynes/cm on a surface.

According to some embodiments, the at least one polymer is selected from polyvinyl-pyrrolidone, polyvinyl alcohol, styrene-maleic anhydride, hydrolyzed grades of styrene-maleic anhydride, an acrylic acid copolymer, a cellulose derivative, a glycol, a polysaccharide, a penta-erythritol based polymer, an alginate, carageenan, a naturally-occurring polysaccharide, a dimethylol propionic acid based polyester, polyamide or polyurethane, a 5-SSIPA (5-(sodiosulfo) isophthalic acid) based polyester, a polyamide and a polyurethane.

In some cases, the at least one surfactant comprises at least one hydrophobic moiety and at least one polar group.

The at least one surfactant may be selected from an anionic surfactant, a cationic surfactant, a non-ionic surfactant, a fatty acid, a fatty alcohol and a polyether-polysiloxane.

In some cases, the surfactant is selected from sodium lauryl sulfate, sodium dodecyl sulfate and trimethylhexadecylammonium chloride.

The at least one polymer may comprise or be formed from styrene maleic anhydride copolymer.

In some embodiments, the at least one surfactant comprises sodium dodecyl sulfate.

According to some embodiments, the composition comprises 2-6% by weight of a solution of a partially esterified styrene maleic anhydride copolymer and 2-6% by weight of sodium dodecyl sulfate.

Some further embodiments of this invention are directed to a substrate coated with a high-resolution ink-jet ink printable coating layer produced from the composition of claim as described herein.

According to some embodiments, the substrate comprises a coating layer having a surface tension of less than 60 dyne/cm.

Preferably, the dry coating layer has a surface tension of less than 40 dyne/cm.

According to some embodiments, the dry coating layer has a surface area/porosity of less than 25%.

The dry coating layer normally has a thickness of 0.05 to 10 microns.

According to some further embodiments, the dry coating layer is adapted to be washed away by spraying with water or aqueous solution. The dry coating layer is normally heat and acid resistant.

According to some embodiments, parts of the coating layer that are covered by cured legend ink are resistant to PCB finishing processes. According to some other embodiments, the parts of the coating layer not covered by the cured legend ink are not resistant to PCB finishing processes.

There is thus provided according to some preferred embodiments of the present invention, a method for forming a substrate coated with a high-resolution ink-jet ink printable coating layer, the method comprising:

i) forming a composition as described herein; and
ii) coating the substrate with the composition so as to form the substrate coated with the high-resolution ink-jet ink printable coating layer.

The at least one polymer may be mixed with water to form one of an aqueous solution and an emulsion. The surfactant may then be added to the aqueous solution or to the emulsion.

According to some embodiments, the coating step may be performed by a process selected from dipping, spraying, roller coating, curtain coating and manual brushing.

The coating step typically forms a coating layer having a thickness of 50 nm to 50 microns. Normally, the coating step forms a coating layer having a surface tension of less than 60 dynes/cm. More preferably, the coating step forms a coating layer having a surface tension of less than 40 dynes/cm.

The method may further comprise printing at least part of the substrate coated with the high-resolution ink-jet ink printable coating layer with ink-jet ink so as to form print on the coating layer, wherein said ink-jet ink has a surface tension of less than 60/dynes/cm.

In some cases, the surface tension of the liquid legend ink is matched to the surface tension of the dry coating layer to within 10 dynes/cm. The ink may be cured thereafter.

After the curing step, the PCB may be washed in an aqueous solution to remove the coating layer from any unprinted (unprinted refer to areas not printed by the legend ink) part of the substrate.

BRIEF DESCRIPTION OF THE DRAWINGS

The invention will now be described in connection with certain embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

DETAILED DESCRIPTION OF PREFERRED EMBODIMENTS

Some embodiments of the present invention are directed to processes and compositions for modifying a surface, such as the surface of the solder resist and/or of metal conductors on a device or PCB, to allow for high resolution durable printing thereupon.

Figure 1A:
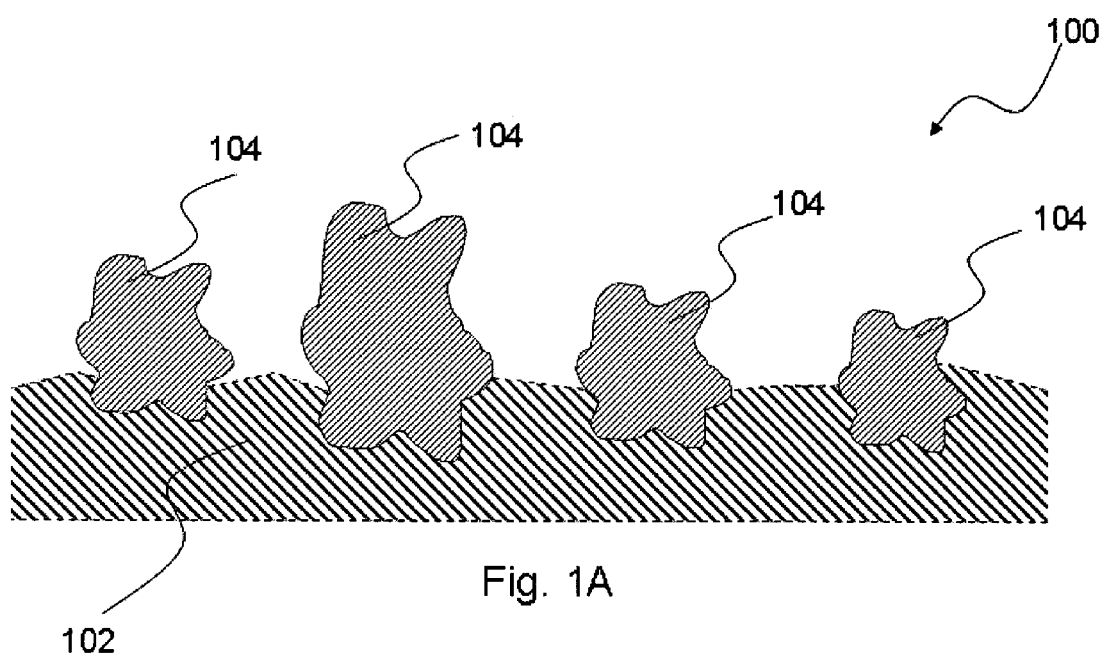
FIG. 1A is a simplified vertical cross-sectional view of a solder mask, prior to coating with the coating of the present invention.

Reference is now made to FIG. 1A, which is a simplified vertical cross-sectional view of a solder mask 100, prior to coating with the coating of the present invention. The solder mask may be mat or semi-mat surface. The surface properties of the solder mask depend on the mechanical structure and chemical properties of a substantially flat surface 102 and on inorganic particles 104 embedded in the surface.

The surface 102 is typically formed from an organic matrix which has a smooth morphology and a medium-low surface tension ranging between (15-75 dynes/cm).

Particles 104 typically comprise one or more inorganic substances, which have a rough morphology and a high surface tension. The combination of the rough particles 104 and smooth organic surface 102 provide very heterogeneous conditions for printing thereupon. The present invention provides a substantially homogeneous layer on top of the solder mask to allow for excellent printing thereupon.

Figure 1B:
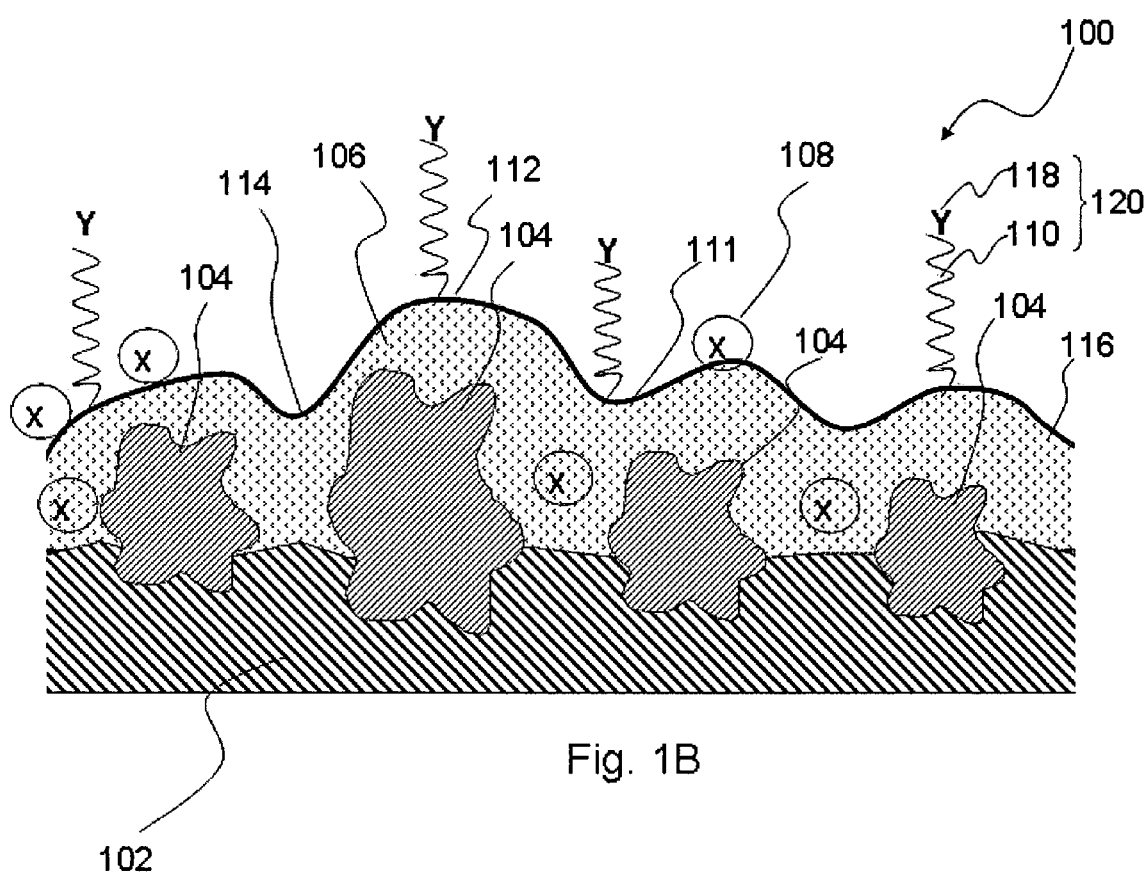
FIG. 1B is a simplified vertical cross-sectional view of a solder mask, after coating with a coating layer according to an embodiment of the present invention.

FIG. 1B is a simplified vertical cross-sectional view of solder mask 100, after coating with a coating layer 106 according to an embodiment of the present invention.

Coating layer 106 smoothes the topology of the surface of the solder mask.

Coating layer 106 comprises various chemical moieties 108, designated (X), for example, but not limited to acidic, anhydride, amino, hydroxyl or ester groups, which provide good adhesion of the layer to the solder mask. Additionally these moieties on an upper surface 116 of the layer influence the hydrophilic properties of the upper surface, which in turn, influence the interface with air and/or with ink to be printed thereupon.

Hydrophobic moieties 120, such as a surfactant, typically comprise a hydrophobic chain 110 and a polar group (Y) 118. Moieties 120 affect the hydrophobic: hydrophilic properties of the surface 116.

A thin coating layer 106 will provide a surface with small hills 112 and troughs 114 (FIG. 1B). A thicker coating layer may provide a surface without hills and troughs (not shown).

The surface treatment composition for forming the surface coating layer comprises three major components:

a) A polymer that is water soluble or water emulsifiable. Examples of such polymers are polyvinyl-pyrrolidone, polyvinyl alcohol, styrene-maleic anhydride including hydrolyzed grades, and moieties 108 that have partially reacted with the maleic anhydride including partially converted esters, partially converted ethers, partially converted amides and partially converted imides and salts thereof, acrylic acid copolymers, cellulose derivatives, glycols, polysaccharides, pentaerythritol based polymers, alginate and similar natural polysaccharides, Dimethylol Propionic acid based polyesters or polyamides or polyurethanes, 5-SSIPA (5-(Sodiosulfo) Isophthalic Acid) based polyesters or polyamides or polyurethanes.

B) Surfactants (120) having at least one hydrophobic moiety 110 and at least one polar group 118. Examples are anionic surfactants, such as sodium lauryl sulfate, cationic surfactants, such as trimethylhexadecylammonium chloride, nonionic surfactants fatty acids, fatty alcohols, polyether-polysiloxane; and C) water.

As used herein a hydrophobic moiety is defined as an aliphatic, aromatic, heterocyclic, or organometallic moiety having from 2 to 200 carbon atoms.

Additional co-solvents, waxes, oils, thickeners, defoamers, preservatives, fillers and pigments may also be added to the composition, in accordance with the requirements of the specific application.

The surface treatment composition components have the following functions:

The water soluble (or emulsifiable) polymer is responsible for the adhesion to substrate, sealing of micro porosity of substrate, reduction of surface area, chemical resistance and high surface energy (high surface tension).

Surfactant 120 is responsible for lowering the surface tension to a required and/or optimal level.

The solution comprises, according to one embodiment of the present invention, about 50 to 99% water, about 0.01 to 60% polymer and about 0.01 to 20%. surfactant. It may also comprise organic solvent or oil as a defoamer.

The solution may be deposited onto the substrate by dipping, spraying, atomizing, curtain coating, roller coating, and manual rubbing or brushing.

The coated wet substrate may be dried at ambient temperature or forced dried in an oven, to form a coating layer or thin film, which builds up in the pores of the substrate, and additionally may build one or more layers above the pores on the surface of the substrate.

The average roughness of the solder mask coated by said method is lowered by this novel coating.

The coated substrate may be further dried by convection in an oven or in an infra-red oven. The surface temperature during drying may vary from about 40 to 150 Celsius.

According to some embodiments, the thickness of the dry film ranges from about 0.05 to 10 microns.

The surface tension of the treated substrate depends upon the ratio between polar moieties X in the polymer to the surfactant 120, the content of additional hydrophobic or hydrophilic additives, the thickness of the surface treatment film and the surface roughness of original substrate. Ideally, the surface tension of the coated solder mask or substrate falls within the range of 15-60 dyne/cm.

After coating the substrate and drying thereof, the coated substrate may be printed with ink from an ink jet.

According to some preferred embodiments, the ink's surface tension properties are similar to those of the coated substrate, that is, smooth, with a surface tension of about 24 to 40 dynes/cm.

One aspect of the present invention is demonstrated when a PCB is coated with the composition of the present invention, and, thereafter, marking legend ink is applied to an outer layer there, is that the ink remains bonded to the surface well enough to withstand the harsh conditions of curing, soldering, surface finishing including, such as, but not limited to, tin plating, electroless nickel gold (ENIG) and solvent cleaning.

After the printing step, such as that described in U.S. Pat. No. 6,754,551 to Zohar, et al., incorporated herein by reference, the ink may be cured, such as by thermal curing. Thereafter, the printed and coated substrate may be washed in water or in another aqueous medium to remove the surface coating from the non-printed areas. Typically, this surface coating removal step is performed in an industrial developer, pre-clean or stripper solution, which removes the coating from the non-printed areas of the substrate.

In one preferred embodiment the solution comprises water, a pH adjusting electrolyte (acidic or basic), surfactant and optionally, a solvent.

It is important that all ingredients are be washed by water and non-toxic media, so that the industrial application of this invention is not limited by environmental issues.

EXAMPLES

A series of coating compositions were prepared, based on three components, which are defined in Table 1.

For most applications the compositions were made by mixing the polymer(s) and surfactant(s) in water in a stirred vessel, such as a glass beaker with a magnetic stirrer. In cases, in which the polymer is emulsified with water, it is mixed in the water with a standard laboratory mixing system at up to 20,000 rpm, blender, shearing system or homogenizer, as are known in the art (sometimes cooled in an ice bath)

TABLE 1

Compositions of the aqueous compositions for forming coating layers

| Material name | Description | Role in formula | Weight percentage in composition A | Weight percentage in composition B | Weight percentage in composition C |
|---|---|---|---|---|---|
| Impress SC-740, manufactured by Hercules | Styrene Maleic Anhydride Copolymer, partially esterifies, ammonium salt, aqueous solution, 10% solids | Binder, film former, polar polymer with high surface energy, sealer of surface porosity, high temperature resistance | 2 | 2 | 2 |
| Sodium Dodecyl Sulfate | Surfactant | Decrease surface tension of film | 2 | 3 | 0 |
| Water | | | 96 | 95 | 98 |

Example 1

An fully cured, 35 microns thick, semi-mat solder mask (PSR4000MP), which had a highly polar surface which was printed with ink-jet ink on Printar LGP 809, printing in 720 dpi using Printar M2 white marking ink, dried with on-machine air blower and oven cured at around 150 Celsius for 90 minutes, demonstrated a poor print quality using a standard solvent based ink.

The untreated semi-mat solder mask was coated as follows: A cloth impregnated with composition A (Table 1) was used to deposit composition A onto the mask. The coated mask was dried at about 80 Celsius for 15 minutes. Some parts of the coated surface were printed using an ink-jet printer. The coated surface was glossier than the untreated surface and the resultant print quality was excellent. The printed mask was cured at around 150 Celsius for 90 minutes in order to cure the ink.

After curing, the mask was washed in a conveyored water pre-cleaning line to remove the surface coating from the unprinted areas.

The mask was exposed to HAL (hot air solder leveling). Copper parts of the mask were coated by solder yielding a solder of a similar quality to that soldered on copper of uncoated masks.

Adhesion of the cured ink to the coated surface of the mask was found to be of a similar strength to that of cured ink on an untreated mask.

Example 2

The same method of Example 1 was performed using composition B. The resultant coated surface, had a higher surfactant content than that made with composition A, was too hydrophobic. This led to poor wetting of the ink to the surface, due to the high surface hydrophobicity.

Example 3

The same method of Example 1 was performed using composition C (no surfactant). When composition C was applied, the ink did wet the surface well. In this case it appeared that the coated surface was too hydrophilic, and thus the ink was propagated and small characters became illegible.

The references cited herein teach many principles that are applicable to the present invention. Therefore the full contents of these publications are incorporated by reference herein where appropriate for teachings of additional or alternative details, features and/or technical background.

It will be evident to those skilled in the art that the invention is not limited to the details of the foregoing illustrative embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

The invention claimed is:

1. An aqueous polymer solution, useful as surface coating on mat and semi mat solder mask surfaces, to provide an optimized surface tension for high-resolution ink-jet ink, the composition comprising:
   a) at least one polymer selected from a water soluble polymer and a water-emulsifiable polymer, wherein said at least one polymer is present in a concentration of up to 60% by weight; and
   b) at least one surfactant, comprising a long hydrophobic moiety, wherein said at least one surfactant is present in a concentration of up to 10% by weight, wherein said composition is adapted to provide a removable, coating layer of an optimized surface tension of 15-70 dynes/cm for high-resolution ink-jet ink.

2. A composition according to claim 1, wherein said at least one polymer is selected from polyvinyl-pyrrolidone, polyvinyl alcohol, styrene-maleic anhydride, hydrolyzed grades of styrene-maleic anhydride, an acrylic acid copolymer, a cellulose derivative, a glycol, a polysaccharide, a penta-erythritol based polymer, an alginate, carageenan, a naturally-occurring polysaccharide, a dimethylol propionic acid based polyester, polyamide or polyurethane, a 5-SSIPA (5-(sodiosulfo) isophthalic acid) based polyester, a polyamide and a polyurethane.

3. A composition according to claim 1, wherein said at least one surfactant comprises at least one hydrophobic chain and at least one polar group.

4. A composition according to claim 3, wherein said at least one surfactant is selected from an anionic surfactant, a cationic surfactant, a non-ionic surfactant, a fatty acid, a fatty alcohol and a polyether-polysiloxane.

5. A composition according to claim 4, wherein said surfactant is selected from sodium lauryl sulfate, sodium dodecyl sulfate and trimethylhexadecylammonium chloride.

6. A composition according to claim 1, wherein said at least one polymer comprises styrene maleic anhydride copolymer.

7. A composition according to claim 6, wherein said at least one surfactant comprises sodium dodecyl sulfate.

8. A composition according to claim 7, wherein said composition comprises 2% by weight of a solution of a partially esterified styrene maleic anhydride copolymer and 2% by weight of sodium dodecyl sulfate.

9. A substrate coated with a high-resolution ink-jet ink printable coating layer produced from the composition of claim 1.

10. A substrate according to claim 9, wherein said coating layer has a surface tension of less than of less than 60 dyne/cm.

11. A substrate according to claim 10 wherein said coating layer has a surface tension of less than of less than 40 dyne/cm.

12. A substrate according to claim 9, wherein said coating layer has a surface area/porosity of less than 25%.

13. A substrate according to claim 9, wherein said coating layer has a thickness of 0.05 to 10 microns.

14. A substrate according to claim 9, wherein the coating layer is adapted to be washed away by spraying with water or aqueous solution.

15. A substrate according to claim 14 wherein the coating layer is heat and acid resistant.

16. A substrate according to claim 15, wherein parts of the coating layer is resistant to PCB finishing processes, when coated by cured legend ink.

17. A method for forming a substrate coated with a high-resolution ink-jet ink printable coating layer, the method comprising:
   i) forming a composition according to claim 1; and
   ii) coating the substrate with the composition so as to form the substrate coated with the high-resolution ink-jet ink printable coating layer.

18. A method according to claim 17, wherein the at least one polymer is mixed with water to form one of an aqueous solution and an emulsion.

19. A method according to claim 18, wherein the surfactant is added to the aqueous solution or to the emulsion.

20. A method according to claim 17, wherein the coating step is performed by a process selected from dipping, spraying, roller coating, curtain coating and manual brushing.

21. A method according to claim 17 wherein the coating step forms a coating layer having a thickness of 50 nm to 50 microns.

22. A method according to claim 17, wherein the coating step forms a coating layer having a surface tension of less than 60 dynes/cm.

23. A method according to claim 22, wherein the coating step forms a coating layer having a surface tension of less than 30 dynes/cm.

24. A method according to claim 17, further comprising printing at least part of the substrate coated with the high-resolution ink-jet ink printable coating layer with ink-jet ink so as to form print on the coating layer, wherein said ink-jet ink has a surface tension of less than 60/dynes/cm.

25. A method according to claim 24, wherein the surface tension of the ink is matched to the surface tension of the coating layer to within 10 dynes/cm.

26. A method according to claim 24, further comprising curing the print.

27. A method according to claim 26, further comprising washing the substrate in an aqueous solution to remove the coating layer from any unprinted part of the substrate.

* * * * *